United States Patent
Rha

(10) Patent No.: US 6,188,732 B1
(45) Date of Patent: Feb. 13, 2001

(54) DIGITAL FEEDFORWARD AMPLIFIER FOR USE IN AN RF TRANSMITTER AND METHOD OF OPERATION

(75) Inventor: Peter S. Rha, Richardson, TX (US)

(73) Assignee: Samsung Electronics Co., Ltd. (KR)

( * ) Notice: Under 35 U.S.C. 154(b), the term of this patent shall be extended for 0 days.

(21) Appl. No.: 09/174,760

(22) Filed: Oct. 19, 1998

(51) Int. Cl.[7] .............. H04K 1/02; H04L 25/03; H04L 25/49

(52) U.S. Cl. .............. 375/297; 375/296; 330/149

(58) Field of Search .................. 375/295, 296, 375/297; 332/159, 123; 330/149, 151; 455/63; 371/37.01, 43.1

(56) References Cited

U.S. PATENT DOCUMENTS

| | | | |
|---|---|---|---|
| 4,580,105 | 4/1986 | Myer | 330/149 |
| 4,879,519 | 11/1989 | Myer | 330/149 |
| 4,885,551 | 12/1989 | Myer | 330/52 |
| 5,220,557 * | 6/1993 | Kelley | 370/345 |
| 5,304,945 | 4/1994 | Myer | 330/149 |
| 5,570,350 | 10/1996 | Myer et al. . | |
| 5,619,168 | 4/1997 | Myer | 330/149 |
| 5,751,705 * | 5/1998 | Sato | 370/335 |
| 5,894,497 * | 4/1999 | Overton | 375/295 |
| 5,920,808 * | 7/1999 | Jones et al. | 455/127 |
| 5,949,283 * | 9/1999 | Proctor et al. | 330/149 |

\* cited by examiner

Primary Examiner—Stephen Chin
Assistant Examiner—Lenny Jiang
(74) Attorney, Agent, or Firm—John C. Han

(57) ABSTRACT

A digital feedforward (FF) amplifier system is disclosed for use in an RF transmission system. The digital FF amplifier uses digital signal processing to generate error correction signals that reduce intermodulation distortion caused by saturation of the main power amplifier. The digital signals in the improved FF amplifier may be buffered, if necessary, thereby eliminating the need for delay lines. A main amplification branch includes a digital combiner for summing input digital signals, digital-to-analog converters, RF modulation circuitry and a main power amplifier. An error correction signal branch includes an error correction signal generator, digital-to-analog converters, and RF modulation circuitry. The RF outputs of the main amplification branch and the error correction signal branch are combined to produce an RF output signal with reduced distortion. Optionally, an amplifier characterization branch may be included comprising RF output feedback circuitry and an amplifier model. The amplifier model updates the error correction generator with time varying characteristic information about the main power amplifier.

20 Claims, 8 Drawing Sheets

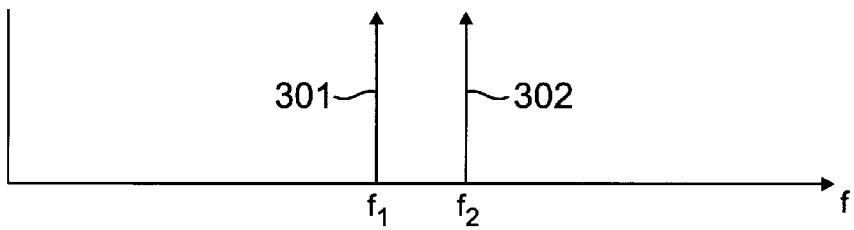
FIG. 3A
(PRIOR ART)
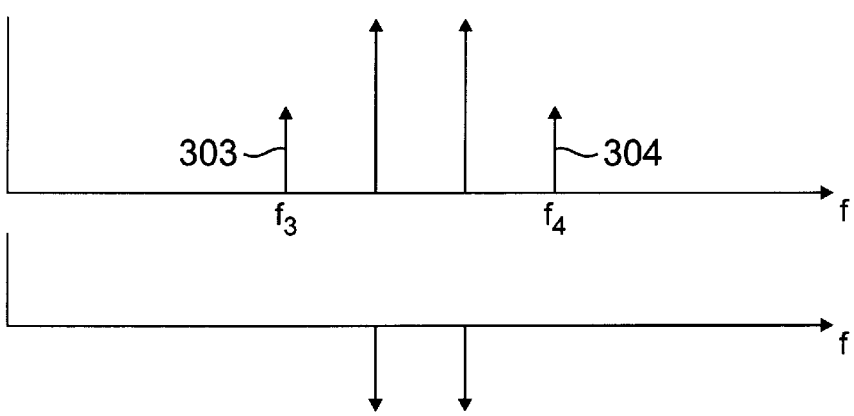
FIG. 3B
(PRIOR ART)
FIG. 3C
(PRIOR ART)
FIG. 3D
(PRIOR ART)
FIG. 3E
(PRIOR ART)
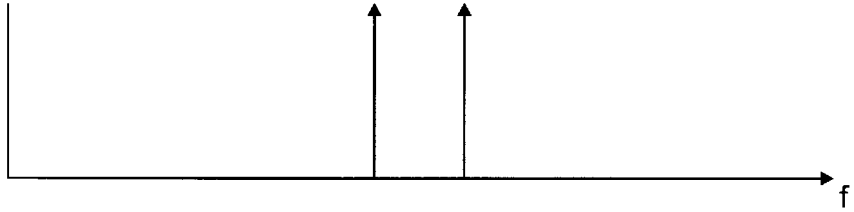
FIG. 3F
(PRIOR ART)

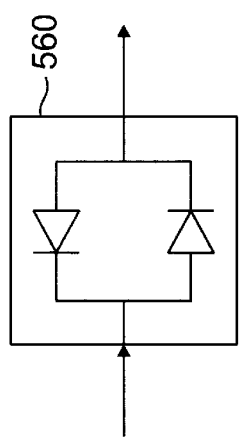
FIG. 6A
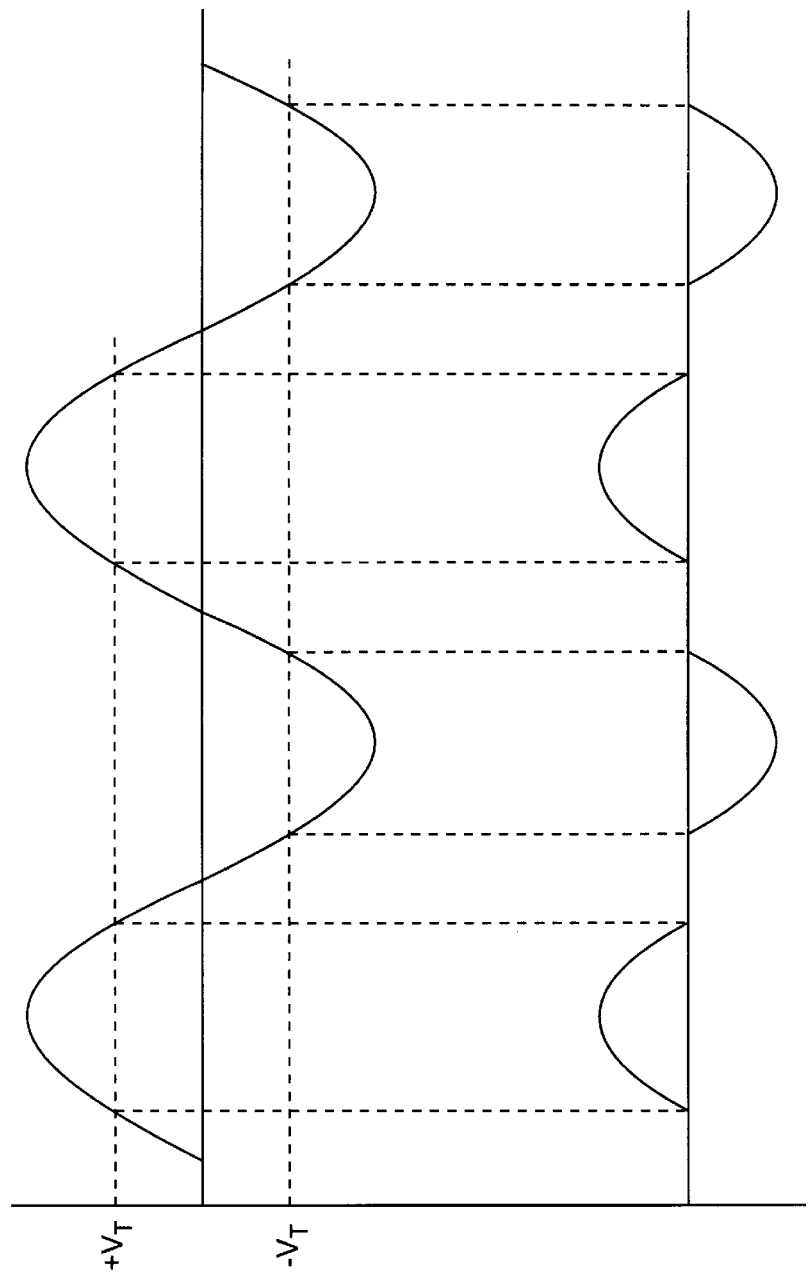
FIG. 6B
FIG. 6C

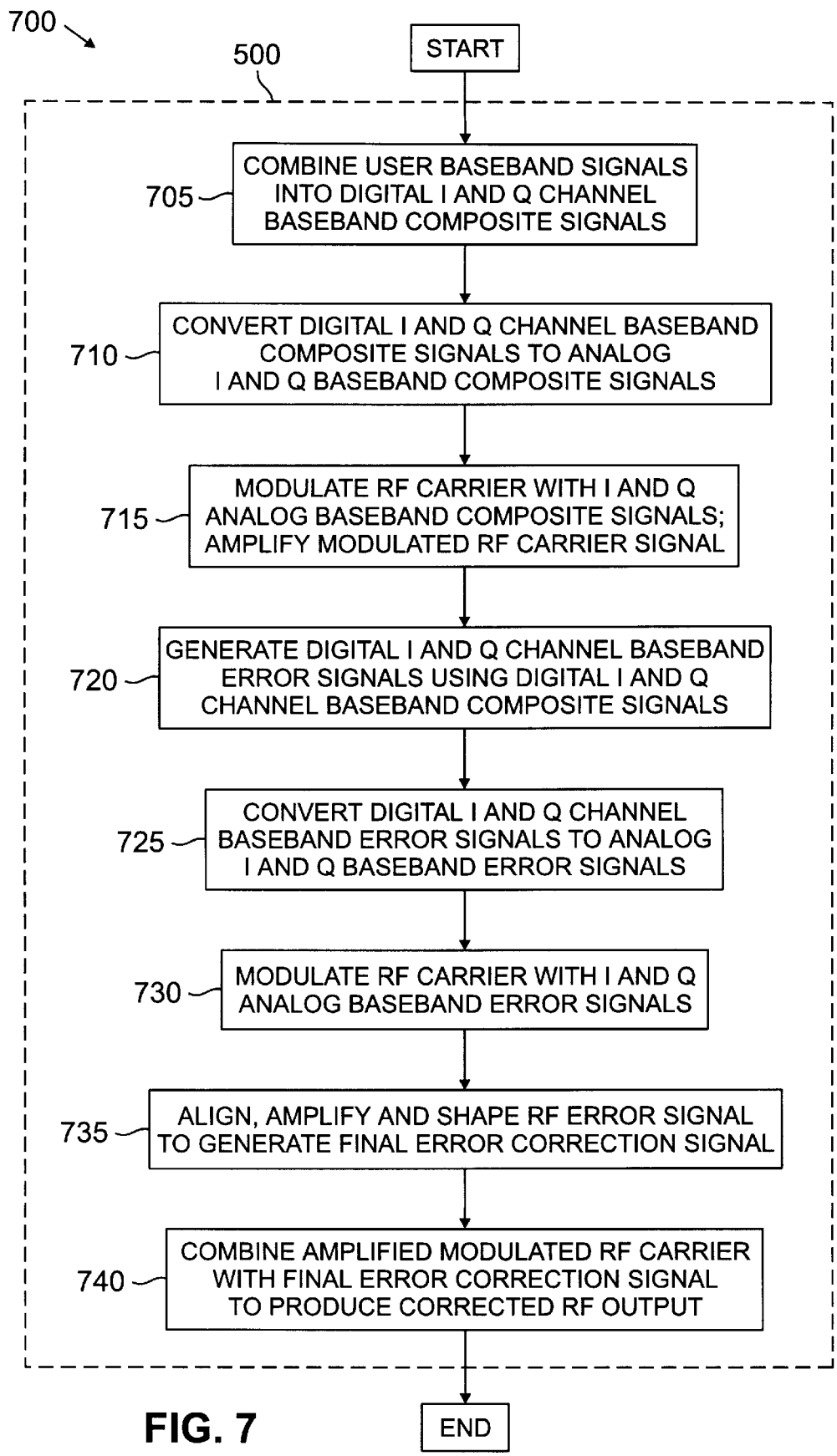

DIGITAL FEEDFORWARD AMPLIFIER FOR USE IN AN RF TRANSMITTER AND METHOD OF OPERATION

CROSS-REFERENCE TO RELATED APPLICATIONS

The present invention is related to that disclosed in U.S. patent application Ser. No. 09/134,194, entitled "SINGLE LOOP FEEDFORWARD AMPLIFIER FOR USE IN AN RF TRANSMITTER AND METHOD OF OPERATION" and filed on Aug. 14, 1998. U.S. patent application Ser. No. 09/134,194 is commonly assigned with the present invention and is incorporated herein by reference for all purposes.

TECHNICAL FIELD OF THE INVENTION

The present invention is directed, in general, to feedforward amplifiers and, more specifically, to digital feedforward amplifiers for use in an RF transmitter in a wireless communications network.

BACKGROUND OF THE INVENTION

In 1996, more than 75 million people worldwide used cellular telephones. Reliable predictions indicate that there will be over 300 million cellular telephone customers by the year 2000. Within the United States, cellular service is offered not only by dedicated cellular service providers, but also by the regional Bell companies, such as U.S. West, Bell Atlantic and Southwestern Bell, and the national long distance companies, such as AT&T and Sprint. The enhanced competition has driven the price of cellular service down to the point where it is affordable to a large segment of the population.

This competition has also led to rapid and sweeping innovations in cellular telephone technology. Analog cellular systems are now competing with digital cellular systems. In order to maximize the number of subscribers that can be serviced in a single cellular system, frequency reuse is maximized by making individual cell sites smaller and using a greater number of cell sites to cover the same geographical area. Accordingly, the increased number of cellular base stations has resulted in increased infrastructure costs. To offset this increased cost, cellular service providers are eager to implement any innovations that may reduce equipment costs, maintenance and repair costs, and operating costs, or that may increase service quality and reliability, as well as the number of subscribers that the cellular system can service.

Much of this innovation has focused on service quality improvements, such as expanded digital PCS services or smaller and lighter cellular phone handsets having a longer battery life, or equipment cost reduction, such as smaller, cheaper, more reliable transceivers for the cellular base stations. However, there has been only limited innovation directed to reducing the operating costs of a cellular system.

Every cellular base station has a transmitter for sending voice and data signals to mobile units (i.e., cell phones, portable computer equipped with cellular modems, and the like) and a receiver for receiving voice and data signals from the mobile units. It is important that the transmitter power amplifier is highly linear, especially for a signal whose envelope changes in time over such a wide range, such as in CDMA or multi-carrier operations. One of the techniques used in the design of highly linear amplifiers is known as the feedforward technique. In the prior art, it is based on two-loop designs. Typically, the first loop isolates the error signal produced by intermodulation distortion in the power amplifier and the second loop subtracts the error signal from the power amplifier output. However, the two-loop designs contain a high number of components and require delay lines in the power amplifier outputs that consume a large amount of power and greatly reduce the efficiency of the transmitter. The need for delay lines is due in part to the fact that the prior art amplifiers are, by and large, analog designs that are unable to buffer signals.

There is therefore a need in the art for improved cellular systems that are less expensive to operate. In particular, there is a need in the art for improved transmitter power amplifiers based on simpler feedforward designs that do not require the use of a delay line in the power amplifier output. There is a further need for feedforward transmitter power amplifiers that are implemented using more reliable digital design techniques, particularly in CDMA systems.

SUMMARY OF THE INVENTION

To address the above-discussed deficiencies of the prior art, it is a primary object of the present invention to provide, for use in an RF transmitter, a new digital amplifier design that simplifies the RF transmitter and eliminates all delay lines. A digital feedforward amplifier is disclosed that uses digital signal processing to generate error correction signals that reduce intermodulation distortion generated in the main power amplifier. The digital signals in the improved feedforward amplifier may be buffered, if necessary, thereby eliminating the need for delay lines. The disclosed invention may be readily adapted for use in cellular or wireless communication systems where multi-channel signals are combined digitally at baseband, such as in code division multiple access (CDMA) systems.

According to one embodiment of the present invention, there is provided, for use in a transmitter in a wireless network, a digital feedforward amplification system comprising a first branch comprising: 1) a digital combiner circuit capable of receiving a plurality of digital input signals and generating from at least one of the plurality of digital input signals at least one digital composite output signal; 2) a DAC circuit for receiving the at least one digital composite output signal and converting the at least one digital composite output signal to at least one analog composite output signal; 3) a modulation circuit capable of receiving a local RF signal and the at least one analog composite output signal and generating therefrom a modulated RF signal; and 4) a power amplifier capable of amplifying the modulated RF signal to produce an amplified RF output signal.

The digital feedforward amplification system further comprises 1) a second branch comprising a distortion correction circuit capable of receiving the at least one digital composite output signal from the digital combiner circuit and generating a correction signal capable of at least partially canceling a distortion signal introduced into the amplified RF output signal by the power amplifier in the first branch; and 2) a combiner circuit capable of combining the amplified RF output signal and the correction signal to thereby at least partially cancel the distortion signal.

According to one embodiment of the present invention, the at least one digital composite output signal comprises a digital in-phase composite output signal and a digital quadrature composite output signal.

According to another embodiment of the present invention, the modulation circuit is a quadrature modulation circuit that receives an analog in-phase composite output signal and an analog quadrature composite output signal from the DAC and generates a quadrature modulated RF signal.

According to still another embodiment of the present invention, a receipt of the at least one digital composite output signal by the DAC circuit from the digital combiner circuit is time delayed with respect to a receipt of the at least one digital composite output signal by the distortion correction circuit.

According to yet embodiment of the present invention, the distortion correction circuit generates the correction signal whenever the at least on digital composite output signal increases above a maximum level capable of causing the power amplifier to enter saturation.

According to further embodiment of the present invention, the digital feedforward amplification system further comprises amplifier characterization circuitry capable of monitoring current operating characteristics of the main power amplifier and providing to the distortion correction circuit update information capable of causing the distortion correction circuit to adjust the correction signal in response to changes in the operating characteristics of the main power amplifier.

According to a still further embodiment of the present invention, the distortion correction circuit further comprises phase shift circuitry capable of shifting a phase of the correction signal relative to a phase of the amplified RF output signal.

In another embodiment of the present invention, the distortion correction circuit further comprises gain adjustment circuitry capable of adjusting an amplitude of the correction signal.

In yet another embodiment of the present invention, the RF correction signal can be further shaped or conditioned to best match the portion of the RF signal in the main branch which has been clipped or distorted by saturation in the main amplifier.

In yet another embodiment of the present invention, at least one delay line can be added in the main or correction branch, if it is needed to obtain time delay adjustment in much finer scale than that can be obtained from the digital buffering delay techniques.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIGS. 3A–3F are diagrams illustrating signal components and distortion components in the frequency domain at various points in the prior art feedforward amplifier in FIG. 2;

FIG. 6A illustrates an exemplary correction signal shaper for use in the digital feedforward amplifier in FIG. 5 according to one embodiment of the present invention;

FIGS. 6B and 6C are diagrams illustrating the operation of the exemplary correction signal generator in the time domain in FIG. 6A according to one embodiment of the present invention;

FIG. 7 is a flow diagram illustrating the operation of the exemplary digital feedforward amplifier in FIG. 5 according to one embodiment of the present invention.

DETAILED DESCRIPTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless network.

Figure 1:
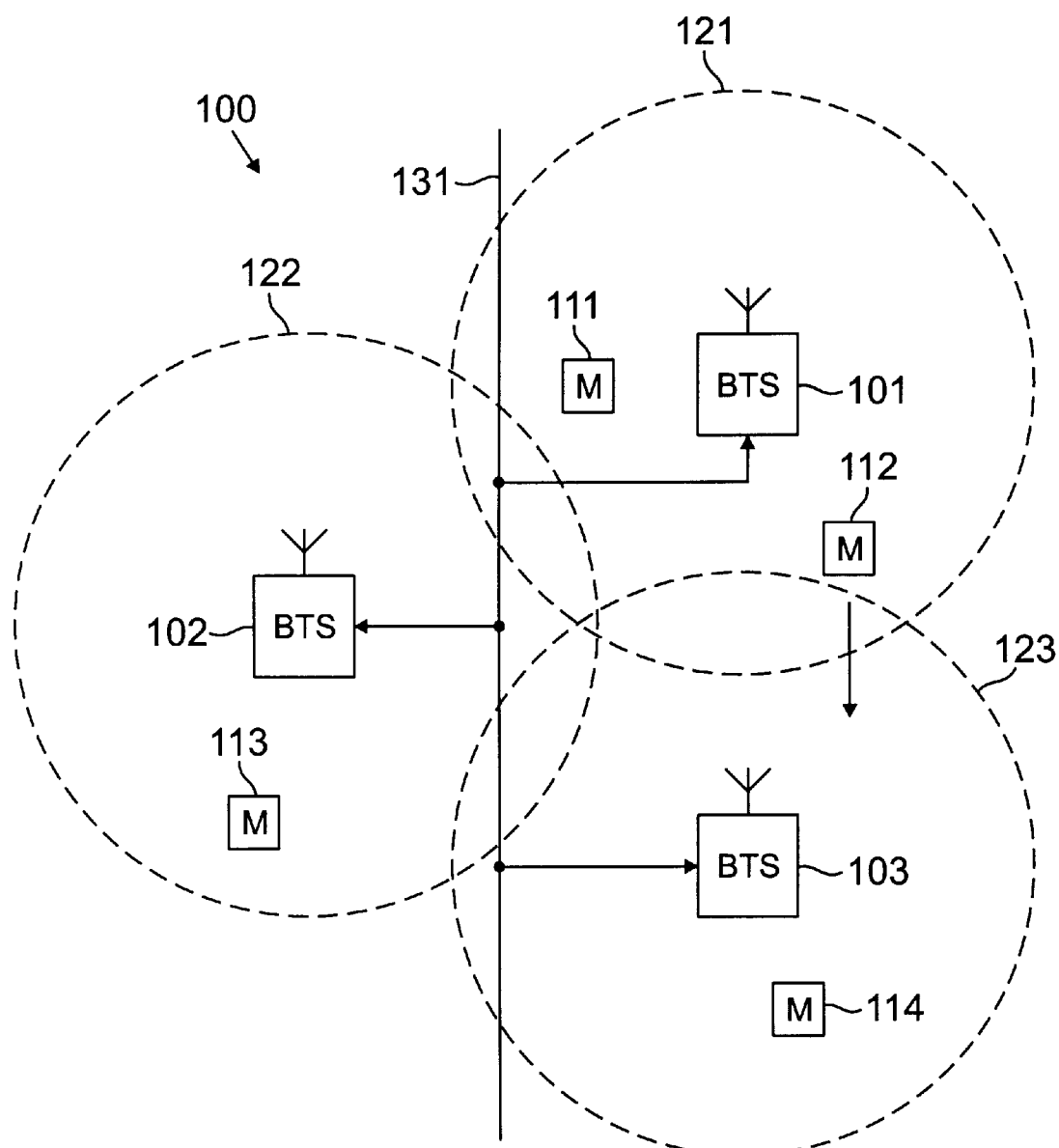
FIG. 1 illustrates an exemplary wireless network according to one embodiment of the present invention.

FIG. 1 illustrates an exemplary wireless network 100 according to one embodiment of the present invention. The wireless telephone network 100 comprises a plurality of cell sites 121–123, each containing one of the base station transceiver substations BTS 101, BTS 102, or BTS 103. In a preferred embodiment of the present invention, the wireless telephone network 100 is a CDMA-based network. Base transceiver stations 101–103 are operable to communicate with a plurality of mobile units (M) 111–114. Mobile units 111–114 may be any suitable cellular devices, including conventional cellular telephones, PCS handset devices, portable computers, metering devices, and the like.

Dotted lines show the approximate boundaries of the cells sites 121–123 in which base transceiver stations 101–103 are located. The cell sites are shown approximately circular for the purposes of illustration and explanation only. It should be clearly understood that the cell sites may have other irregular shapes depending on the cell configuration selected and natural and man-made obstructions.

BTS 101, BTS 102 and BTS 103 transfer voice and data signals between each other and the public telephone system (not shown) via communications line 131. Communications line 131 may be any suitable connection means, including a T1 line, a T3 line, a fiber optic link, a network backbone connection, and the like. In some embodiments, BTS 101, BTS 102 and BTS 103 may be wirelessly linked to one another and/or the public telephone network by a satellite link.

In the exemplary wireless network 100, mobile unit 111 is located in cell site 121 and is in communication with BTS 101, mobile unit 113 is located in cell site 122 and is in communication with BTS 102, and mobile unit 114 is located in cell site 123 and is in communication with BTS 103. The mobile unit 112 is located in cell site 121, close to the edge of cell site 123. The direction arrow proximate mobile unit 112 indicates the movement of mobile unit 112 towards cell site 123. At some point as mobile unit 112 moves into cell site 123 and out of cell site 121, a "handoff" will occur.

A "handoff" is a well-known process for transferring control of a call from a first cell to a second cell. For example, if mobile unit 112 is in communication with BTS 101 and senses that the signal from BTS 101 is becoming unacceptably weak, mobile 112 may then switch to a BTS that has a stronger signal, such as the signal transmitted by BTS 103. Mobile unit 112 and BTS 103 establish a new communication link and a signal is sent to BTS 101 and the public telephone network to transfer the on-going voice and/or data signals through the BTS 103. The call is thereby seamlessly transferred from BTS 101 to BTS 103.

Within each of BTS 101–103, transmitter circuitry receives voice and data traffic from communications line 131 and modulates it for transmission as, for example, a TDMA signal, an FDMA signal, or a CDMA signal. The transmitter circuitry includes a transmitter power amplifier that boosts a modulated input RF signal to the appropriate power level needed for transmission. It is important that the power amplifier maintain linearity across variations in the power and the frequency of the input RF signal. To maintain linearity, amplifiers designs that employ feedforward techniques can be used.

Figure 2:
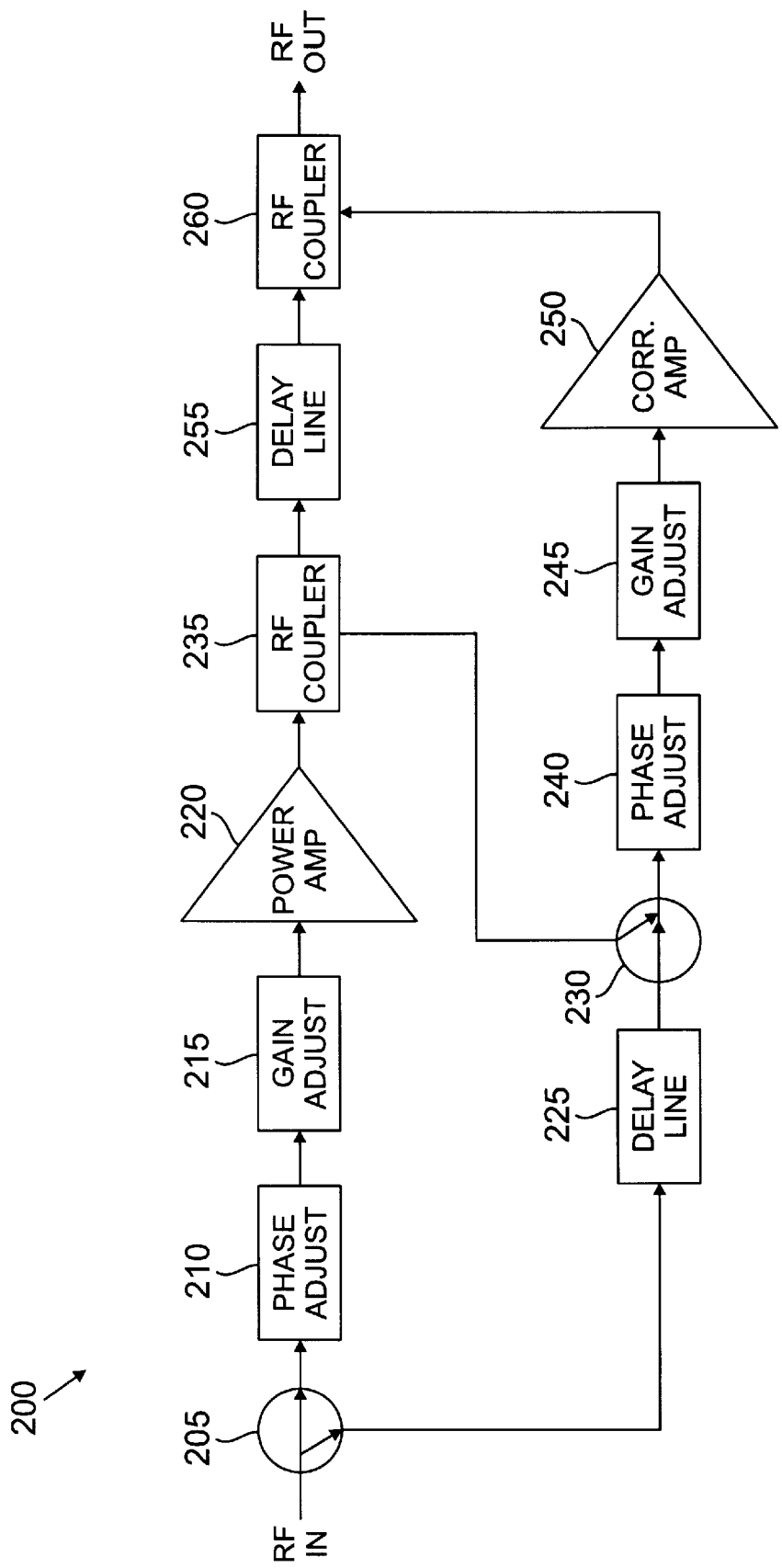
FIG. 2 illustrates a conventional feedforward amplifier for use in a BTS transmitter according to one embodiment of the prior art.

FIG. 2 illustrates conventional two-loop feedforward amplifier 200 for use in a BTS transmitter according to one embodiment of the prior art. FIGS. 3A–3F are frequency diagrams illustrating signal components and distortion components at various points in feedforward amplifier 200 in FIG. 2. FIGS. 3A–3F will also be used below in connection with FIG. 5 in the description of the present invention.

The signal RF IN, which may be a CDMA modulated signal, a TDMA modulated signal, an FDMA modulated signal, or the like, is received by signal splitter 205. FIG. 3A depicts an exemplary RF IN signal comprising signal component 301 and signal component 302. Signal component 301 occurs at a frequency of $f_1$ and signal component 302 occurs at a frequency of $f_2$. Signal splitter 205 outputs two copies of the RF IN signal, wherein each copy may optionally have some gain factor applied by signal splitter 205.

One copy of the RF IN signal is processed by phase adjust controller 210, gain adjust controller 215, and power amplifier 220. Phase adjust controller 210 may be adjusted to shift the phase of the RF IN signal. Gain adjust controller 215 may be adjusted to apply some amount of gain to the RF IN signal. Power amplifier 220 then applies a larger amount of gain to the RF IN signal received from gain adjust controller 215.

The non-linear response of power amplifier 220 produces intermodulation distortion (IMD) in the output of power amplifier 220. FIG. 3B depicts an exemplary output of power amplifier 220 in the frequency domain. The output of power amplifier 220 includes the RF IN signal, comprising signal component 301 and signal component 302, and an IMD signal, comprising signal component 303 and signal component 304. Signal component 303 occurs at a frequency of $f_3$ and signal component 304 occurs at a frequency of $f_4$.

The second copy of the RF IN signal is processed by delay line 225 and signal combiner 230. RF coupler 235 receives the (RF IN+IMD) signal on the output of power amplifier 220 and applies it to one input of signal combiner 230. RF coupler 235 may also apply some gain factor to the (RF IN+IMD) signal. The output of delay line 225 is a time-delayed version of RF IN and may be attenuated due to loss in delay line 225. The output of delay line 225 is applied to the second input of signal combiner 230, such that cancellation takes place between the RF IN component of the (RF IN+IMD) signal and the time delayed version of the RF IN signal received from delay line 225.

FIG. 3C illustrates the inverted time-delayed RF IN signal that is, in effect, combined with the (RF IN+IMD) signal by signal combiner 230. By adjusting the gain applied by gain adjust controller 215 and the phase shift applied by phase adjust controller 210, the RF IN signal components received on the two inputs of the signal combiner 230 may be aligned in equal magnitude but opposite in phase, thereby canceling each other at the output of signal combiner 230. Ideally, the output of signal combiner 230 therefore comprises only the IMD signal components received from RF coupler 235. FIG. 3D illustrates the isolated IMD signal components at the output of signal combiner 230. Optionally, signal combiner 230 may apply a gain factor to IMD signal on its output.

Thus, signal splitter 205, phase adjust controller 210, gain adjust controller 215, power amplifier 220, delay liner 225, RF coupler 235 and signal combiner 230 comprise the first loop of the two-loop feedforward amplifier 200. The first loop amplifies the RF IN signal and isolates the IMD signal components, if any, produced by non-linear distortion and saturation of power amplifier 220. The second loop of the two-loop feedforward amplifier 200, described below, cancels the IMD signal components, if any, from the amplified output of power amplifier 200.

The second loop of the two-loop feedforward amplifier 200 comprises phase adjust controller 240, gain adjust controller 245 and correction amplifier 250, that are used to phase shift and amplify the isolated IMD components received from signal combiner 230. The second loop also comprises delay line 255 and RF coupler 260. The output of delay line 255 received by RF coupler 260 is a time-delayed version of the (RF IN+IMD) signal depicted in FIG. 3B and may optionally be scaled by some positive or negative gain factor caused by RF coupler 235 and/or delay line 255.

The other input of RF coupler 260 receives the IMD components illustrated in FIG. 3E from the output of correction amplifier 250. This signal is an inverted and amplified version of the isolated IMD components in FIG. 3D. Phase adjust controller 240, gain adjust controller 245 and correction amplifier 250 adjust the phase and amplitude of the IMD components received by RF coupler 260, such that cancellation of the IMD signal components on both inputs of RF coupler 260 occurs. FIG. 3F illustrates the output signal, RF OUT, on the output of RF coupler 260. The RF OUT signal is an amplified version of the RF IN signal. The IMD signal components are canceled from RF OUT.

Figure 4A:
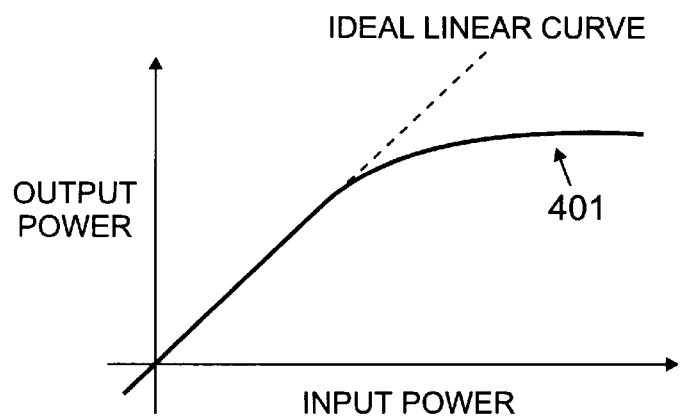
FIGS. 4A and 4B are input/output response diagrams illustrating the non-linear operation of the power amplifier in the time domain in the prior art feedforward amplifier in FIG. 2.
Figure 4B:
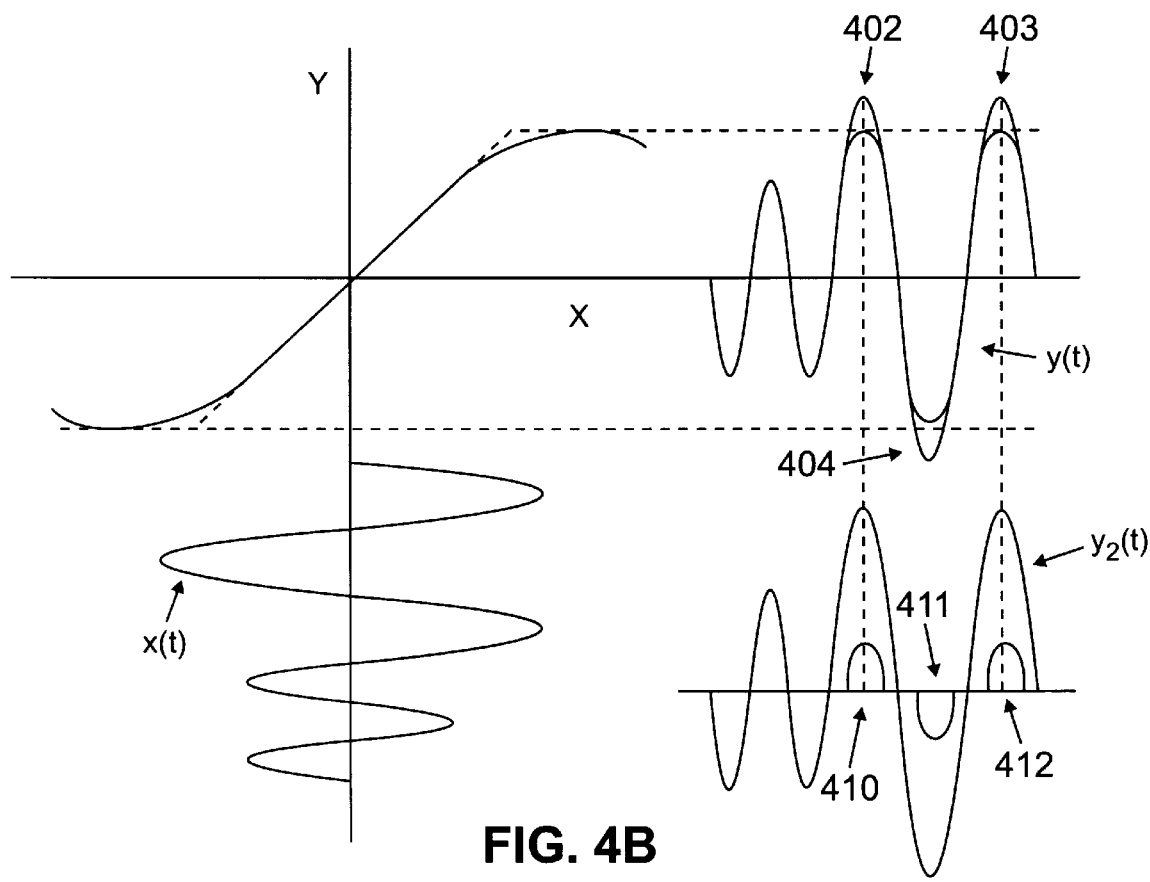

FIGS. 4A and 4B are input/output response diagrams illustrating the non-linear operation of power amplifier 220 in prior art feedforward amplifier 200 in FIG. 2. In FIG. 4A, curve 401 illustrates that as input power increases from a low level, output power initially rises linearly, as shown by the dotted line representation of the ideal linear curve. However, when input power becomes too great, the output power levels off (i.e., becomes non-linear) and the curve 401 flattens. In FIG. 4B, an exemplary sinusoidal input X(t) increases in amplitude such that the power amplifier 220 saturates. The peaks 402, 403 and 404 of the idealized output Y(t) (shown as a dotted line) are clipped and a distorted sinusoidal output results. The "missing" portions of the clipped peaks 402, 403, and 404 are shown as waveforms 410, 411 and 412 under, and in alignment with, an idealized output Y₂(t) (shown as a dotted line).

The conventional two-loop feedforward amplifier 200 contains a large number of circuit elements, including two delay lines. Delay line 225 is used to compensate for the processing delays through phase adjust controller 210, gain adjust controller 215 and power amplifier 220. Delay line 255 is used to compensate for the processing delays through phase adjust controller 240, gain adjust controller 245 and correction amplifier 250. Additionally, delay line 255 is coupled to the output of power amplifier 220 and delays a high-power signal. The power loss in delay line 255 is significant and reduces the overall efficiency of the two-loop feedforward amplifier 200.

The above-described problems inherent in the prior art are overcome by a new digital amplifier design that simplifies the RF transmitter and eliminates all delay lines. The present invention comprises a digital feedforward amplifier that uses digital signal processing to generate error correction signals that reduce intermodulation distortion caused by saturation of the main power amplifier. Buffers or other digital circuits may be used to delay one or more of the digital signals in the feedforward amplifier, thereby eliminating the need for delay lines. The improved digital feedforward amplifier described below may be implemented in a wide variety of RF transmission systems, including FDMA and TDMA cellular systems, and is particularly useful in code division multiple access (CDMA) systems in which multi-channel signals are combined digitally at baseband.

Figure 5:
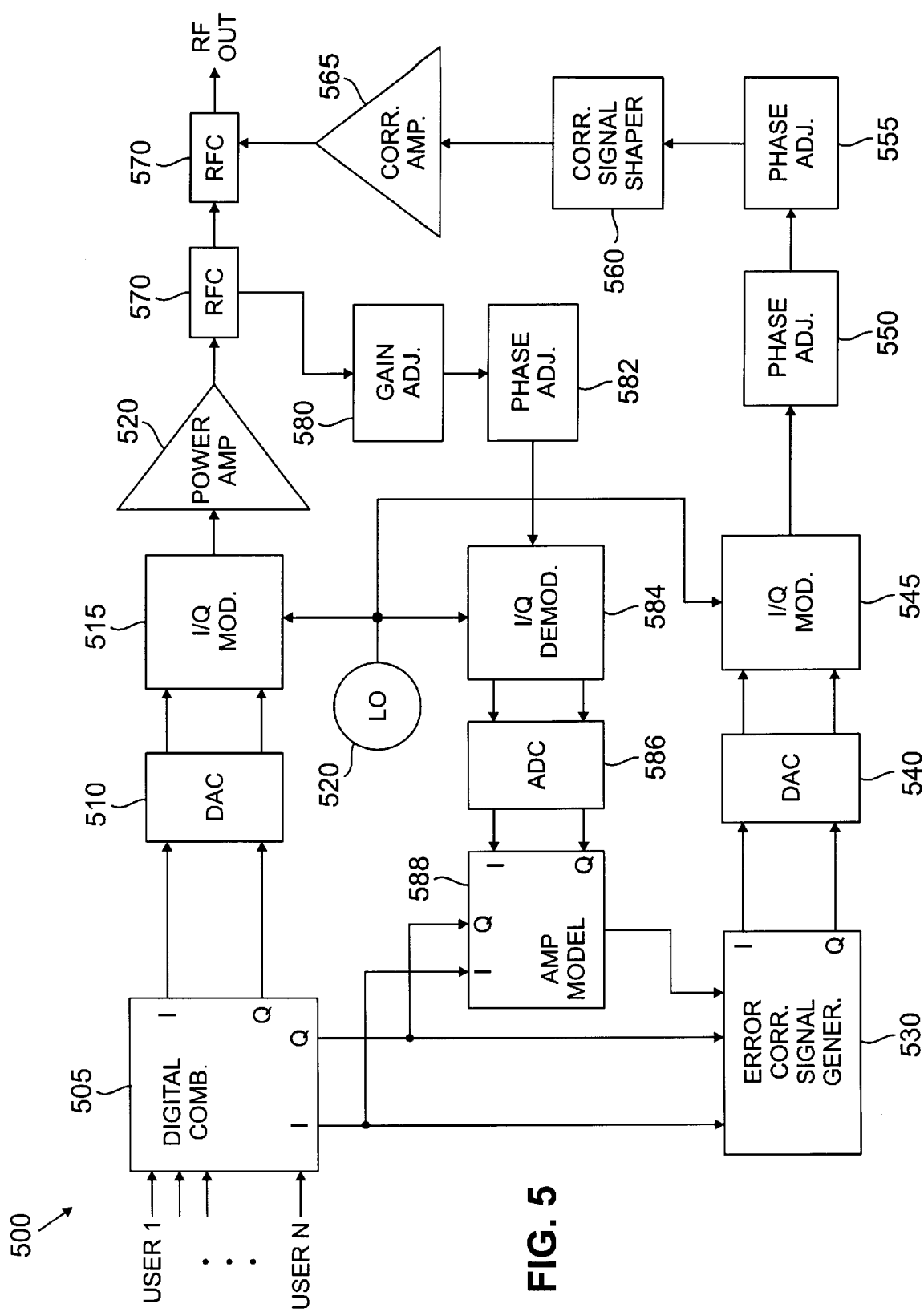
FIG. 5 illustrates an exemplary digital feedforward amplifier for use in a transmitter in one or more of the base transceivers in the exemplary wireless network in FIG. 1 according to one embodiment of the present invention.

FIG. 5 illustrates exemplary digital feedforward amplifier 500 for use in a transmitter in one or more of BTS 101–103 in the exemplary wireless network 100 according to one embodiment of the present invention. For the purposes of clarity and brevity in describing the present invention, it shall be assumed that the digital feedforward amplifier 500 is implemented in a CDMA system using quadrature phase shift keying (QPSK). However, those skilled in the art will understand that the principles of the present invention may readily be adapted for use in other types of RF transmission systems, including TDMA and FDMA.

Digital feedforward amplifier 500 comprises two principal signal processing branches. A first branch, or main amplification branch, comprises digital combiner 505, digital-to-analog converter (DAC) 510, I/Q modulator 515, power amplifier 520, and RF couplers 570 and 575. The second branch, or error correction signal branch, comprises error correction signal generator 530, digital-to-analog converter (DAC) 540, I/Q modulator 545, phase adjust controller 550, gain adjust controller 555, correction signal shaper 560, and correction amplifier 565.

Optionally, digital feedforward amplifier 500 may also include an amplifier characterization branch comprising gain adjust controller 580, phase adjust controller 582, I/Q demodulator 584, analog-to-digital converter (ADC) 586, and amplifier model circuit 588. The amplifier characterization branch is used to update the error correction generator 530 with information about power amplifier 520. This is done to compensate for changes in the characteristics of power amplifier 520, which may change in time over a range of temperatures and operating frequencies.

Digital combiner 505 receives CDMA encoded baseband signals from up to N users and combines them to produce two composite digital signals: an in-phase (I) channel baseband composite signal and a quadrature phase (Q) channel baseband composite signal. The individual CDMA encoded baseband signals received from each user comprise a stream of digitized samples of, for example, the user=s voice signal. Each of the composite digital I channel and Q channel baseband signals may be a varying number of bits (e.g., 8, 11, 14, 16 bits, etc.) in width, depending on the implementation.

It should be understood that although digital combiner 505 generally receives more than one input CDMA encoded baseband signals at a time, it is possible that digital combiner 505 may only receive one input CDMA encoded baseband signal from time to time and, perhaps, no signal at all. Therefore, the composite digital I channel baseband signal and/or the composite digital Q channel baseband signal generated by digital combiner 505 may actually be derived from only one input CDMA encoded baseband signal. In such a case, the "composite" digital I channel baseband signal and/or the "composite" digital Q channel baseband signal will be directly related to the single input CDMA encoded baseband signal that was received by digital combiner 505.

Digital combiner 505 transmits one pair of the digital I channel and Q channel baseband composite signals to DAC 510. Digital combiner 505 transmits another pair of the digital I channel and Q channel baseband composite signals to error correction generator 530 and amplifier model 588. In a preferred embodiment of the present invention, digital combiner 505 contains internal delay circuitry that introduces a variable length time delay between the transmission of the pair of digital I channel and Q channel baseband composite signals sent to DAC 510 and the transmission of the pair of digital I channel and Q channel baseband composite signals sent to error correction generator 530 and amplifier model 588. The variable length delay is adjusted to compensate for differences in signal processing times in the main amplification branch and the error correction signal branch. The internal delay circuitry may comprise clocked data buffers (or clocked latches), or any one of many other well-known delay circuits.

DAC 510 converts the digital I and Q channel baseband composite signals to analog I and Q channel baseband composite signals. I/Q modulator 515 receives the analog I and Q channel baseband composite signals and uses them to modulate an RF carrier signal received from local oscillator (LO) 520. The output signal of I/Q modulator 515 is the modulated RF signal that is to be transmitted.

Next, power amplifier 520 amplifies the modulated RF signal generated by I/Q modulator 515. It is at this point that intermodulation (IMD) distortion may be introduced in the output of power amplifier 520 if the input signal is sufficiently large to cause saturation of power amplifier 520. The output of power amplifier 520 is fed through RF couplers 570 and 575 to produce the output signal, RF OUT.

The I channel and Q channel composite signals produced by digital combiner 505 have time varying amplitudes. From time to time, the composite signals will be combined by I/Q modulator 515 in such a way as to generate a modulated RF signal having a large enough amplitude to saturate power amplifier 520. When this occurs, error correction signal generator 530 generates digital I channel and Q channel correction signals that are used to cancel out the distortion in the output of power amplifier 520. The point at which power amplifier 520 saturates is determined by the values of the I channel and Q channel baseband composite signals and the operating conditions, including temperature and operating frequency, of power amplifier 520. Thus, error generator 530 uses the values of the I channel and Q channel baseband composite signals and update information, described hereafter, received from amplifier model 588 to determine the correct digital I channel and Q channel correction signals.

The digital I channel and Q channel correction signals generated by error correction signal generator 530 are converted to an analog I channel baseband error correction signal and an analog Q channel baseband error correction signal by DAC 540. The I and Q channel baseband error correction signals are transmitted by DAC 540 to I/Q modulator 545, which uses them to modulate the RF carrier signal produced by local oscillator 520. The output of I/Q modulator 545 is a modulated RF signal that may be phase shifted by phase adjust controller 550 and adjusted in amplitude by gain adjustment 555. Generally, phase adjust controller 550 may be used to accurately align the sinusoidal waveform peaks in the modulated RF signal generated by I/Q modulator 545 with the sinusoidal waveform peaks in the modulated RF signal in the output of power amplifier 520.

Correction signal shaper 560 is used to isolate the sinusoidal waveform peaks in the modulated RF output signal produced by I/Q modulator 545. Since only the peaks of the sinusoidal output of power amplifier 520 are clipped in the non-linear region during saturation, only the peaks of the sinusoidal output of I/Q modulator 545 need to be added back to the clipped output of power amplifier 520 in order to correct IMD distortion. Thus, correction signal shaper 560 produces the "missing" portions of the clipped peaks 402, 403, and 404, which are shown as waveforms 410, 411 and 412 in FIG. 4. The output power of correction signal shaper 560 is then boosted by correction amplifier 565 in order to drive RF coupler 575.

Optionally, one or more analog delay lines can be added in the main or correction branch, or both, if the delay line(s) is needed to obtain time delay adjustments in much finer scale than that can be obtained from the digital buffering delay techniques. For example, an adjustable analog delay line may be added at the input of power amplifier 520 or at the input of correction amplifier 565.

FIG. 6A illustrates an exemplary embodiment of correction signal shaper 560 which is based on diode design. Only two diodes are used in its simplest form, for illustration purposes only. FIGS. 6B and 6C are time domain diagrams illustrating the operation of exemplary correction signal shaper 560. FIG. 6B is an input sinusoid received by correction signal shaper 560. The diodes in correction signal shaper 560 clip all portions of the input sinusoid between $+V_T$ and $-V_T$, where $+V_T$ and $-V_T$ are the threshold voltages whose values are related to the non-linear characteristic of the power amplifier 515. Thus, the output of the correction signal shaper 560, shown in FIG. 6C, comprises the positive and negative clipped peaks of the input sinusoid. Phase adjust controller 550 and gain adjust controller 560 may be used to adjust the amplitudes and phase of the clipped peaks.

RF coupler 575 receives the clipped RF signal from power amplifier 520 via RF coupler 570 and receives the amplified shaped error correction signal, comprising the positive and negative clipped peaks in FIG. 6C, from correction amplifier 565. RF coupler 575 combines the two input signals and outputs the signal RF OUT.

When the modulated RF signal received by power amplifier 520 is sufficiently small, power amplifier 520 operates linearly and its output is not clipped. At this point, the output of correction amplifier 565 is zero. However, when the modulated RF signal increases and the sinusoidal peaks on the output signal of power amplifier 520 begin to clip, the output of correction amplifier 565 increases to add back the "missing" portions of the clipped peaks (for example, waveforms 410, 411 and 412 in FIG. 4). Ideally, the clipped output of power amplifier 520 and the shaped correction signal on the output of correction amplifier 565 are combined by RF coupler 575 such that the RF OUT signal is an non-clipped, properly amplified sinusoidal signal.

Since the technique described above generates a correction signal in the baseband and modulates it into an RF signal, the shape of the correction signal may not exactly match the clipped portion of the main signal. Nonetheless, computer simulations performed by the applicant have shown that the shape or the correction signal is generally close enough to reduce the level of intermodulation distortion by a significant amount at the output of the digital feedforward transmitter. The correction signal shaper in the correction branch may be used to further improve the shape of the correction signal to better match the clipped portion of the main signal.

Generally, the performance characteristics of an amplifier, such as power amplifier 520, can be characterized and it is therefore possible to design correction signal shaper 560 to generate the clipped part of the signal at the output of power amplifier 520. This being the case, it will generally be possible to set the phase adjustment on phase adjust controller 550 and to set the gain adjustment on gain adjust controller 555 so that correction amplifier 565 begins to output a shaped correction signal when power amplifier 520 begins to saturate.

Furthermore, the amplifier characterization branch, comprising gain adjust controller 580, phase adjust controller 582, I/Q demodulator 584, analog-to-digital converter (ADC) 586, and amplifier model circuit 588, may be used to update error correction signal generator 530 in order to produce accurate I channel and Q channel error correction signals. RF coupler 570 receives the output of power amplifier 520 and generates therefrom a "characterization" signal that is transmitted to gain adjust controller 580 and phase adjust controller 582. Gain adjust controller 580 may be used to adjust the amplitude of the characterization signal and phase adjust controller 582 is used to phase shift the characterization signal. The output of phase adjust controller 582 received by I/Q demodulator 584 is therefore a gain-adjusted, phase-shifted copy of the RF output of power amplifier 520.

I/Q demodulator 584 also receives the RF carrier generated by local oscillator 520. I/Q demodulates then demodulates the RF output of power amplifier 520 to thereby produce two analog baseband signals: an in-phase (I) channel baseband characterization signal and a quadrature (Q) channel baseband characterization signal. The analog I channel and Q channel baseband characterization signals are then converted to digital I channel and Q channel baseband characterization signals by ADC 586.

The digital I channel and Q channel baseband characterization signals are received by amplifier model 588, which also receives the original digital I channel and Q channel baseband composite signals from digital combiner 505. The amplifier model 588 also contains amplifier characteristic information associated with power amplifier 520, and receives temperature and operating frequency data for power amplifier 520. By comparing the original input baseband signals and the clipped output baseband signal fed back from the output of power amplifier 520, amplifier model 588 generate update information that is sent to error correction signal generator 530. The update information allows error correction signal generator 530 to determine more accurately the amount of clipping that is occurring to the original digital I channel and Q channel baseband composite signals. The error correction signal generator 530 can then generate digital I channel and Q channel correction signals more accurately.

FIG. 7 is a flow diagram 700 illustrating the operation of exemplary digital feedforward amplifier 500 in FIG. 5 according to one embodiment of the present invention. Initially, the CDMA encoded user baseband signals are combined into digital I and Q channel baseband composite signals (process step 705). Next, the digital I and Q channel baseband composite signals are converted into analog I and Q channel baseband composite signals (process step 710). The analog I and Q channel baseband composite signals are then used to provide quadrature modulation of an RF carrier signal. The quadrature modulated RF carrier is then amplified for transmission (process step 715).

In order to eliminate distortion that may be introduced by the amplification of the quadrature modulated RF carrier, digital I and Q channel baseband error signals are generated from the original digital I and Q channel baseband composite signals (process step 720). The digital I and Q channel baseband error signals are then converted to analog I and Q channel baseband error signals (process step 725).

The analog I and Q channel baseband error signals are used to provide quadrature modulation of an RF carrier signal (process step 730). The quadrature modulated RF error signal is then aligned, amplified and shaped to produce a final error correction signal (process step 735). Finally, the amplified quadrature modulated RE carrier is combined with the final error correction signal to produce an undistorted RF output for transmission (process step 740). It should be noted that process steps 720–740 may be performed in parallel with process steps 705–715.

Figure 8:
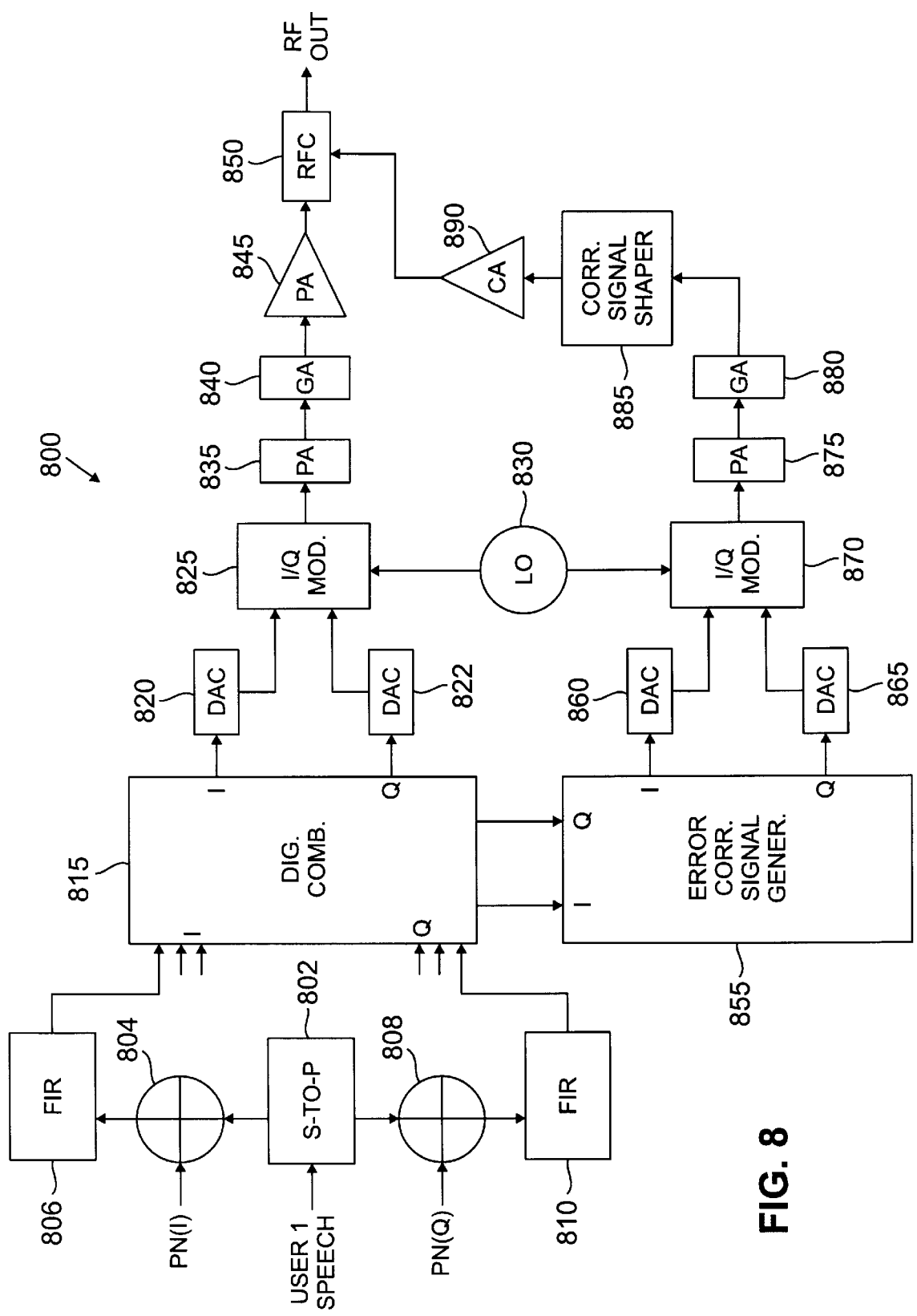
FIG. 8 illustrates an exemplary transmitter incorporating digital feedforward amplifiers according to one embodiment of the present invention.

FIG. 8 illustrates exemplary transmitter 800 incorporating digital feedforward amplifiers according to one embodiment of the present invention. Initially, digital samples of speech from User 1 are input to serial-to-parallel (S-to-P) circuit 802, which sends half the bits from each digital sample to exclusive-OR gate 804 and sends the other half of the bits to exclusive-OR gate 808. The bits sent to each exclusive-OR gate are sent in parallel to ensure synchronous processing in the I and Q channels of all of the bits in each digital sample.

Exclusive-OR gate 804 combines each bit received from S-to-P circuit 802 with an I channel pseudo-random noise (PN(I)) pattern to thereby produce a spread baseband signal (or CDMA encoded signal) suitable for use in a CDMA system. The CDMA encoded signal is passed through finite impulse response (FIR) filter 806 in order to limit the bandwidth of the spread signal.

Likewise, exclusive-OR gate 808 combines each bit received from S-to-P circuit 802 with a Q channel pseudo-random noise (PN(Q)) pattern to thereby produce a spread baseband signal (CDMA encoded signal) suitable for use in a CDMA system. The CDMA encoded signal is passed through finite impulse response (FIR) filter 810 in order to limit the bandwidth of the spread signal.

The outputs of FIR filter 808 and FIR filter 810 are the I channel and Q channel inputs to digital combiner 815. Likewise, digital combiner 815 receives similar I channel and Q channel baseband voice signals for User 2, User 3, User 4, . . . , and User N. Digital combiner 815 then combines the individual I and Q channel baseband voice signals to produce digital I and Q channel baseband composite signals.

One pair of the digital I and Q channel baseband composite signals are sent to DAC 820 and DAC 822, respectively. DAC 820 converts the digital I channel baseband composite signal to an analog I channel baseband composite signal. DAC 822 converts the digital Q channel baseband composite signal to an analog Q channel baseband composite signal. I/Q modulator 825 uses the analog I and Q channel baseband composite signals to provide quadrature modulation for an RF carrier received from local oscillator 830.

Another pair of the digital I and Q channel baseband composite signals produced by digital combiner 815 are sent to error correction signal generator 855. Error correction signal generator 855 produces digital I and Q channel baseband error signals. For the purposes of clarity and brevity, the characterization branch circuits shown in FIG. 5, including amplifier model 588, are omitted from FIG. 8. Further explanation of characterization branch circuits in connection with FIG. 8 would be redundant.

The digital I and Q channel baseband error signals generated by error correction signal generator 855 are sent to DAC 860 and DAC 865, respectively. DAC 860 converts the digital I channel baseband error signal to an analog I channel baseband error signal. DAC 865 converts the digital Q channel baseband error signal to an analog Q channel baseband error signal. I/Q modulator 870 uses the analog I and Q channel baseband error signals to provide quadrature modulation for an RF carrier received from local oscillator 830.

The quadrature-modulated RF carrier signal produced by I/Q modulator 825 may be phase-shifted by phase adjust (PA) controller 835, and have its amplitude adjusted by gain adjust (GA) controller 840. After gain and phase adjustments, the quadrature-modulated RF carrier is then amplified by power amplifier (PA) 845, at which time distortion may be introduced by saturation of power amplifier 845.

The quadrature-modulated RF error signal produced by I/Q modulator 870 may be phase-shifted by phase adjust (PA) controller 875, and have its amplitude adjusted by gain adjust (GA) controller 880. After gain and phase adjustments, the quadrature-modulated RF error correction signal is then processed by correction signal shaper 885, which operates in substantially the same manner as correction signal shaper 560 in FIG. 5. The power of the shaped error correction signal at the output of correction signal shaper 885 is then boosted by correction amplifier (CA) 890 in order to drive RF coupler (RFC) 850.

RF coupler (RFC) 850 then combines the shaped error correction signal received from correction amplifier 890 and the quadrature-modulated RF carrier signal received from power amplifier 845 to thereby produce a distortion-free RF OUT signal suitable for transmission.

Although the present invention has been described in detail, those skilled in the art should understand that they can make various changes, substitutions and alterations herein without departing from the spirit and scope of the invention in its broadest form.

What is claimed is:

1. For use in a transmitter in a wireless network, a digital feedforward amplification system comprising:
    a first branch comprising:
        a digital combiner circuit capable of receiving a plurality of digital input signals and generating from at least one of said plurality of digital input signals at least one digital composite output signal;
        a DAC circuit for receiving said at least one digital composite output signal and converting said at least one digital composite output signal to at least one analog composite output signal;
        a modulation circuit capable of receiving a local RF signal and said at least one analog composite output signal and generating therefrom a modulated RF signal; and
        a power amplifier capable of amplifying said modulated RF carrier signal to produce an amplified RF output signal;
    a second branch comprising a distortion correction circuit capable of receiving said at least one digital composite output signal from said digital combiner circuit and generating a correction signal capable of at least partially canceling a distortion signal introduced into said amplified RF output signal by said power amplifier in said first branch; and
    a combiner circuit capable of combining said amplified RF output signal and said correction signal to thereby at least partially cancel said distortion signal.

2. The digital feedforward amplification system set forth in claim 1 wherein said at least one digital composite output signal comprises a digital in-phase composite output signal and a digital quadrature composite output signal.

3. The digital feedforward amplification system set forth in claim 2 wherein said modulation circuit is a quadrature modulation circuit that receives an analog in-phase composite output signal and an analog quadrature composite output signal from said DAC and generates a quadrature modulated RF carrier signal.

4. The digital feedforward amplification system set forth in claim 1 wherein a receipt of said at least one digital composite output signal by said DAC circuit from said digital combiner circuit is time delayed with respect to a receipt of said at least one digital composite output signal by said distortion correction circuit.

5. The digital feedforward amplification system set forth in claim 1 wherein said distortion correction circuit generates said correction signal whenever said at least one digital composite output signal increases above a maximum level capable of causing said power amplifier to enter saturation.

6. The digital feedforward amplification system set forth in claim 1 further comprising amplifier characterization circuitry capable of monitoring current operating characteristics of said power amplifier and providing to said distortion correction circuit update information capable of causing said distortion correction circuit to adjust said correction signal in response to changes in said operating characteristics of said power amplifier.

7. The digital feedforward amplification system set forth in claim 1 wherein said distortion correction circuit further comprises phase shift circuitry capable of shifting a phase of said correction signal relative to a phase of said amplified RF output signal.

8. The digital feedforward amplification system set forth in claim 1 wherein said distortion correction circuit further comprises gain adjustment circuitry capable of adjusting an amplitude of said correction signal.

9. A wireless communication system comprising a plurality of base stations operable to communicate with a plurality of mobile units, wherein at least one of said plurality of base stations includes a digital feedforward amplification system comprising:
    a first branch comprising:
        a digital combiner circuit capable of receiving a plurality of digital input signals and generating from at least one of said plurality of digital input signals at least one digital composite output signal;
        a DAC circuit for receiving said at least one digital composite output signal and converting said at least one digital composite output signal to at least one analog composite output signal;
        a modulation circuit capable of receiving a local RF signal and said at least one analog composite output signal and generating therefrom a modulated RF signal; and
        a power amplifier capable of amplifying said modulated RF carrier signal to produce an amplified RF output signal;
    a second branch comprising a distortion correction circuit capable of receiving said at least one digital composite output signal from said digital combiner circuit and generating a correction signal capable of at least partially canceling a distortion signal introduced into said amplified RF output signal by said power amplifier in said first branch; and
    a combiner circuit capable of combining said amplified RF output signal and said correction signal to thereby at least partially cancel said distortion signal.

10. The wireless communication system set forth in claim 9 wherein said at least one digital composite output signal comprises a digital in-phase composite output signal and a digital quadrature composite output signal.

11. The wireless communication system set forth in claim 10 wherein said modulation circuit is a quadrature modulation circuit that receives an analog in-phase composite output signal and an analog quadrature composite output signal from said DAC and generates a quadrature modulated RF carrier signal.

12. The wireless communication system set forth in claim 9 wherein a receipt of said at least one digital composite output signal by said DAC circuit from said digital combiner circuit is time delayed with respect to a receipt of said at least one digital composite output signal by said distortion correction circuit.

13. The wireless communication system set forth in claim 9 wherein said distortion correction circuit generates said correction signal whenever said at least one digital composite output signal increases above a maximum level capable of causing said power amplifier to enter saturation.

14. The wireless communication system set forth in claim 9 wherein said digital feedforward amplification system further comprises amplifier characterization circuitry capable of monitoring current operating characteristics of said power amplifier and providing to said distortion correction circuit update information capable of causing said distortion correction circuit to adjust said correction signal in response to changes in said operating characteristics of said power amplifier.

15. The wireless communication system set forth in claim 9 wherein said distortion correction circuit further comprises phase shift circuitry capable of shifting a phase of said correction signal relative to a phase of said amplified RF output signal.

16. The wireless communication system set forth in claim 9 wherein said distortion correction circuit further comprises gain adjustment circuitry capable of adjusting an amplitude of said correction signal.

17. For use in a transmitter in a wireless network, a method for generating an RF output signal comprising the steps of:

combining one or more of a plurality of digital input signals to produce at least one digital composite output signal;

converting the at least one digital composite output signal to at least one analog composite output signal;

modulating a local RF signal with the at least one analog composite output signal to produce a modulated RF signal;

amplifying the RF modulated signal to produce an amplified RF output signal; and generating from the at least one digital composite output signal a correction signal capable of at least partially canceling a distortion signal introduced into the amplified RF output signal by the step of amplifying.

18. The method as set forth in claim 17 wherein the step of generating comprises the substep of generating the correction signal from the at least one digital composite output signal whenever the at least one digital composite output signal increases above a maximum level capable of causing the power amplifier to enter saturation.

19. The method as set forth in claim 17 wherein the at least one digital composite output signal comprises a digital in-phase composite output signal and a digital quadrature composite output signal.

20. The method as set forth in claim 17 wherein the at least one analog composite output signal comprises an analog in-phase composite output signal and an analog quadrature composite output signal and the step of modulating produce a quadrature modulated RF carrier signal.

* * * * *